United States Patent [19]

Redel et al.

[11] Patent Number: 5,580,291

[45] Date of Patent: Dec. 3, 1996

[54] METHOD FOR MANUFACTURING A GLOW CATHODE FOR AN ELECTRON TUBE

[75] Inventors: Thomas Redel, Roettenbach; Clemens Fiebiger, Erlangen, both of Germany

[73] Assignee: Siemens Aktiengesellschaft, Munich, Germany

[21] Appl. No.: 493,737

[22] Filed: Jun. 22, 1995

[30] Foreign Application Priority Data

Jun. 22, 1994 [DE] Germany .......................... 44 21 809.5

[51] Int. Cl.$^6$ ........................................ H01J 9/04
[52] U.S. Cl. ......................... 445/28; 445/51; 445/58; 427/78; 427/250; 427/383.7; 427/405
[58] Field of Search .................. 445/51, 50, 58, 445/28; 427/78, 404, 405, 376.8, 383.7, 250

[56] References Cited

U.S. PATENT DOCUMENTS

| | | | |
|---|---|---|---|
| 3,703,405 | 11/1972 | Brenner et al. | 427/405 X |
| 4,142,023 | 2/1979 | Bornstein et al. | 427/405 X |
| 4,576,699 | 3/1986 | Sato et al. | |
| 4,894,257 | 1/1990 | Smith et al. | 427/78 |
| 4,956,070 | 9/1990 | Nakada et al. | |
| 4,957,463 | 9/1990 | Branovich et al. | 427/50 |

FOREIGN PATENT DOCUMENTS 0143222   11/1987   European Pat. Off. .

*Primary Examiner*—Kenneth J. Ramsey
*Attorney, Agent, or Firm*—Hill, Steadman & Simpson

[57] ABSTRACT

In a method for manufacturing a glow cathode for an electron tube, a layer of an alloy, such as iridium-lanthanum ($Ir_2La$), is produced on a substrate by coating the substrate, such as in a number of layers, with the components of the alloy by deposition from the vapor phase, such that the components of the alloy are present in the stoichiometrically correct ratio on the substrate, and in that the substrate is heated for a time duration adequate for alloy formation to a temperature that is lower than the melting temperature of the phase of the alloy having the lowest melting point.

20 Claims, 4 Drawing Sheets 5,580,291

METHOD FOR MANUFACTURING A GLOW CATHODE FOR AN ELECTRON TUBE

BACKGROUND OF THE INVENTION

1. Field of the Invention

The present invention is directed to a method for manufacturing a glow cathode for an electron tube, the glow cathode comprising a layer of an alloy of a metal of the group Ru, Rh, Pd, Os, Ir, Pt, Re and an element of the group Ba, Ca, La, Y, Gd, Ce, Th, U on a substrate.

2. Description of the Prior Art

A glow cathode is used as an electron emitter in devices such as x-ray tubes. A layer of the composition cited above is located at least in the region in which the electron emission should preferably ensue. Such layers have a high electron emission capability at low operating temperatures, and thus have a long useful life with improved mechanical stability.

European Application 0 143 222 discloses a method for manufacturing a glow cathode of the type initially cited. In this known method, the alloy or a corresponding intermetallic compound is first produced by a smelting or powder metallurgical procedure and is then pulverized and applied onto the substrate in a wet-mechanical, chemical, galvanic or smelting metallurgical procedure. The manufacture of coatings according to this known method thus involves substantial outlay and is correspondingly costly.

SUMMARY OF THE INVENTION

An object of the present invention is to provide a method of the type initially which can be implemented simply and economically.

This object is achieved according to the invention in a method for manufacturing a glow cathode for an electron tube, the glow cathode comprising a layer of an alloy of a metal of the group Ru, Rh, Pd, Os, Ir, Pt, Re and an element of the group Ba, Ca, La, Y, Gd, Ce, Th, U on a substrate wherein the substrate is coated with a selected metal and a selected element of the respective groups by deposition from the vapor phase such that the metal and the element of the respective groups are present in a quantity ratio on the substrate corresponding to that of the alloy of the layer to be produced, and the substrate is heated for a time duration adequate for forming the alloy.

The deposition of the two alloy components from the vapor phase can ensue in any known way, for example by electron beam, from the crucible, by evaporation, particularly laser evaporation, sputtering, etc. The metal and element can be applied in succession onto the substrate or simultaneous coating with both alloy components can take place. The formation of the alloy ensues as a solid-state reaction during heating following the coating of the substrate, or during the coating process in a preferred embodiment of the invention. The duration of the heating is always made shorter as the temperature to which the substrate is heated for forming the alloy becomes higher. Thus the coating of the invention can be produced with an outlay that is clearly reduced in comparison to known methods, and thus is more economic. The quantity ratio of the alloy components is to be selected corresponding to the stoichiometry of the desired alloy. Of course, in practice not only will the alloy layer constitute the desired alloy composition, but also it will unavoidably have local regions that contain more of the one or more of the other alloy components. The alloy composition of the layer will correspond to the quantity ratio of the alloy components only on average.

It is advantageous for the temperature to which the coated substrate is heated for forming the alloy to be lower than the melting temperature of the phase of the alloy having the lowest melting temperature because, otherwise, there would be the risk of evaporation of the layer as well as the risk that the substrate would be incipiently etched by liquid components of the layer if the melting point of the phase having the lowest melting temperature were exceeded.

If the substrate is heated (i.e., pre-heated) during the coating process, preferably to a temperature that is lower than the melting temperature of the phase of the alloy having the lowest melting point, the creation of cracks in the layer being formed is less likely. At the same time, a time-saving is achieved since the alloy formation is at least partially accomplished during the coating of the substrate. Depending on the layer thickness and coating duration, the coating duration can already suffice for the formation of the alloy in the entire layer. The energy being released during the course of the coating process can, depending on the coating method, already be adequate to order to affect the required heating. Otherwise, additional energy must be applied for the purpose of heating. If the coating duration does not suffice for the complete formation of the alloy, the temperature can be held for the required time immediately following the coating process for forming the alloy in the entire layer. There is also the possibility, however, of cooling and then pre-heating the coated substrate to the required temperature, possibly after removal thereof from the coating means which were employed. The melting temperature of the phase of the alloy having the lowest melting point cannot be exceeded in this case for the reasons already cited.

In order to oppose the formation of cracks in the layer, whether before or after the alloy formation, any cooling which may follow the heating which served the purpose of forming the alloy should ensue gradually. In conjunction with avoiding cracks, there is also the possibility of gradually lowering the temperature during the heating required for the alloy formation, this, however, leading to a lengthening of the time required for the alloy formation.

It is fundamentally possible to coat the substrate in alternation with the metal and the element of the group in a number of layers, whereby the coating process can optionally be begun with the metal or the element group. It is simpler, however, to simultaneously coat with the metal and the element of the group. This can occur by separately or simultaneously evaporating the metal and the element of the respective groups or by sublimating the alloy, for example, by sputtering, from the metal and the element of the groups. In the former instance, the apparatus provided for the implementation of the method must be fashioned such that it is possible to deposit two substances separately but simultaneously from the vapor phase. One source for the vapor of the metal and one source for the vapor of the element of the group must thus be present. In the latter instance, one source is adequate, but the alloy of the metal and the element of the group must be available as solid material.

It can be expedient under certain circumstances to deposit a thin layer of the metal from the vapor phase in a further method step following the coating with the metal and the element of the groups. This offers the advantage that an oxidation of the coating is avoided and manipulation and storing reliability are enhanced. For this purpose, it is adequate for the thickness of the layer of the metal not to exceed, or to only insignificantly exceed, that thickness required in order to completely protect the layer lying therebelow. A protective layer can also be produced when, given a substrate coated in alternation with the metal and the element of the groups in a number of layers, a layer of the metal is applied as a last layer, the thickness thereof being selected such that it exceeds the thickness required stoichiometrically for alloy formation, so that a layer of the metal remains after the formation of the alloy.

The application of a protective layer can also be expedient following the heating which served the purpose of forming the alloy if required by the conditions under which the substrate is to be manipulated or stored. The temperature occurring in the application of the protective layer, however, then should not exceed 200° C. in order to oppose an alloy formation of the metal of the layer with the material lying therebelow.

According to versions of the invention, the substrate can be provided with a thin layer of a material suitable as a diffusion barrier before the coating with the alloy. The layer provided as a diffusion barrier can be provided with a thin layer of a material suitable as wetting agent before the coating with the alloy. According to one version of the invention, the substrate is composed of refractory material, for example tungsten (W), molybdenum (Mo), tantalum (Ta), niobium (Nd), zirconium dioxide ($ZrO_2$), etc. Given a substrate of tungsten, tungsten carbide ($W_2C$ and/or WC) is suitable as a diffusion barrier as well as a wetting agent. The functions of the diffusion barrier and of the wetting agent thus can be advantageously satisfied by a single layer. The layer of tungsten carbide, for example, can be produced by vapor-depositing carbon onto the substrate of tungsten and subsequent heating to temperatures on the order of magnitude of 1500° C. in a reducing atmosphere.

Particularly suitable as alloy components are platinum (Pt), osmium (Os) and, in particular, iridium (Ir) as the metal and cerium and, in particular, lanthanum (La) as the element of the respective groups. This is especially true when, according to a preferred embodiment of the invention, the method step of heating to the temperature lying below the melting temperature of the phase of the alloy having the lowest melting point ensues by heating the glow cathode within the electron tube, particularly during the course of baking during evacuation of the electron tube. The aforementioned elements (Pt, Os, Ir, and La, Ce) are well-suited for glow cathodes because the layer formed thereof already emits electrons to an adequate extent at a relatively low operating temperature and their melting point lies above the operating temperature by an adequate degree. It should be assured for layers formed of other elements that the melting point lies at least approximately 200° C. above the operating temperature.

DESCRIPTION OF THE PREFERRED EMBODIMENTS

Figure 1:
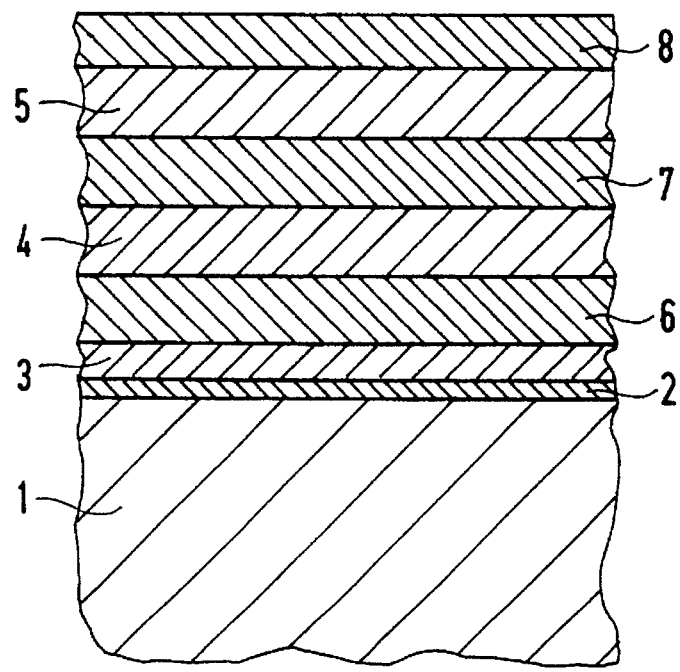
FIGS. 1 and 2 are respective schematic illustrations of a section through a substrate intended for a glow cathode and having a layer manufactured according to an inventive method before and after the tempering.

For manufacturing a glow cathode, a substrate of a refractory material, for example a material from the group W, Mo, Ta, Nb, $ZrO_2$, is first provided with a layer suitable as a diffusion barrier and a wetting agent at least in a region of its surface to be coated. When, as in the case of the described exemplary embodiment, tungsten is employed as the material for the substrate, the substrate is first carbonized in a known way (for example, by heating to 1500° C. in an atmosphere that contains carbon, for example, $CO_2$), so that a layer of tungsten carbide arises as the diffusion barrier and wetting agent.

The carbonized substrate is then secured by holders at its two side surfaces. This arrangement is introduced into a high-vacuum furnace (p <$10^{-6}$ mbar) in which the evaporation system is situated. This is composed, for example, of a electron gun and of two crucibles, one crucible containing a metal of the group Ru, Rh, Pd, Os, Ir, Pt, Re-iridium in the case of the described exemplary embodiment—and the other contains an element of the group Ba, Ca, La, Y, Gd, Ce, Th, U-lanthanum in the case of the described exemplary embodiment. The spacing and the position of the substrate relative to the evaporation system are selected such that an adequate uniformity of the layer thickness is assured. The coating begins, for example, with a layer of lanthanum having a defined layer thickness. Subsequently, a layer of iridium is vapor-deposited, at a suitable layer thickness. A further layer of lanthanum follows. The thickness of the iridium layer is selected such that a quantity ratio of lanthanum and iridium as is stoichiometrically required for the formation of $Ir_2La$ with the two adjoining lanthanum layers is present. In view of the fact that a further iridium layer follows, the second lanthanum layer is twice as thick as the first layer since the following alloy formation ensues in both directions, i.e. with both lanthanum layers. The coating with iridium and lanthanum is continued in alternation and ends with a layer of iridium whose thickness in the described exemplary embodiment is larger than is stoichiometrically required for the formation of $Ir_2La$. As a result, it is assured that an iridium layer will remain as a protective layer after the end of the alloy formation. When such a protective layer is not required, the thickness of the last layer is limited to that parameter required stoichiometrically for the alloy formation.

During the coating process, the carbonized substrate is held at a temperature that is lower than the melting temperature of the phase of the alloy having the lowest melting point in order to avoid the formation cracks in the layer. In the case of iridium and lanthanum, this is a temperature of, for example, 600° C. since the melting temperature of the phase of the iridium-lanthanum system, namely of the eutectic, having the lowest melting point lies at approximately 730° C. The dissipated heat occurring anyway in the coating of the substrate is already adequate under certain circumstances to effect the required heating. Additional heat is introduced as required.

The carbonized substrate having the individual layers of lanthanum and iridium is schematically illustrated in FIG. 1 composed of the substrate 1, the tungsten carbide layer 2 that has arisen due to the carbonization, lanthanum layers 3, 4 and 5 and iridium layers 6, 7 and 8. The iridium layer 8 has an increased thickness for the formation of a protective layer; the thickness of the iridium layer 8 which is stoichiometrically required for the alloy formation is indicated with broken lines. Those skilled in the art will recognize that the illustration of FIG. 1 is idealized, since the alloy formation already begins during the coating as a consequence of diffusion events promoted due to the heating which occurs during the coating and, differing from what is shown in FIG. 1, layers clearly demarcated from one another are no longer present at the end of the coating process.

For alloy formation, or for ending the alloy formation, the substrate 1, which was gradually cooled to room temperature after the coating, is tempered in the vacuum at 600° C. for several hours. The temperature of 600° C. lies below the melting temperature of that phase of the alloy being formed that has the lowest melting point, i.e., below the melting point of the eutectic of the system iridium-lanthanum (730° C.). The required heating can ensue indirectly with a separate heat source or directly as a result of direct current passage. In the case of heating by direct current passage, the required current can flow, for example, between the aforementioned holders. The duration of the tempering event is dependent on the thickness of the individual layers 3 through 8 and is becomes shorter as thinner layers 3 through 8 are employed.

Figure 2:
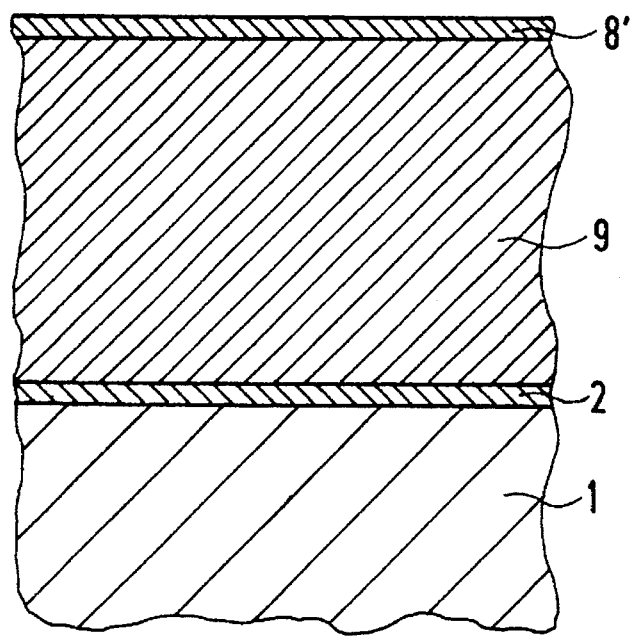

The tempered substrate is schematically illustrated in FIG. 2 composed of the substrate, the tungsten carbide layer 2, the iridium-lanthanum ($Ir_2La$) layer 9 formed by the tempering and a protective layer 8' of iridium, which is the remainder of the iridium layer 8 not consumed in the alloy formation. Again, it is evident that in the actual product, differing from the idealized representation shown in FIG. 2, there is not a sharp boundary between the iridium-lanthanum layer 9 and the protective layer 8'. Within the iridium-lanthanum layer 9, the inherently desired alloy, i.e. $Ir_2La$, is, of course, not present at all locations after the end of the tempering process that lasts only a limited time, for example 30 minutes. On the contrary, alloys higher in lanthanum, for example $Ir_3La_7$, will be present at some locations and alloys lower in lanthanum, for example $Ir_5La$, will be present at other locations.

Figure 3:
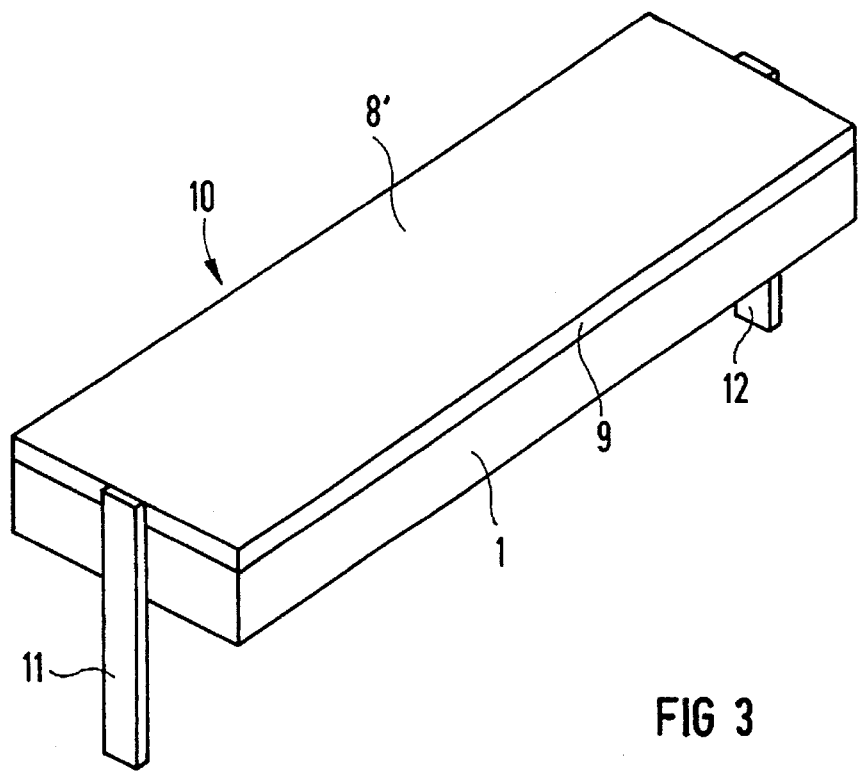
FIGS. 3 and 4 perspective views respectively of two forms of a glow cathode which contain a substrate having a layer manufactured according to the inventive method.

FIG. 3 shows a glow cathode 10 that is constructed using a substrate coated according to the above method. The same reference characters as in FIG. 2 are employed in FIG. 3, the glow cathode 10 thus having the substrate 1, the iridium-lanthanum layer 9 and the protective layer 8'.

The glow cathode 10 is formed as a flat emitter, i.e., the substrate 1 has two planar surfaces that are plane-parallel in the case of FIG. 3, only one thereof being coated. This coated surface is that region in which the emission of electrons should ensue.

The glow cathode 10 of FIG. 3 is provided with terminals 11 and 12 that serve the purpose of input and output of the filament current, i.e. the glow cathode 10 shown in FIG. 3 is heated by direct current passage therethrough for electron emission. It is understood, however, that it is also possible, given employment of a glow cathode with a substrate manufactured in the above-described way to indirectly heat this glow cathode in a known way for electron emission.

Figure 4:
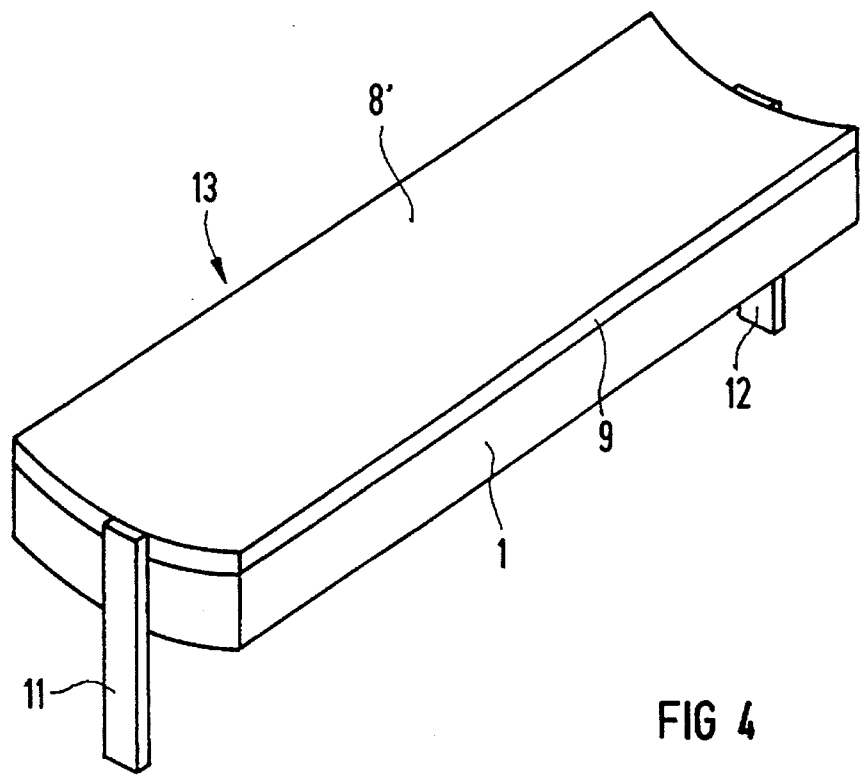

Whereas the glow cathode 10 shown in FIG. 3 is, as mentioned, a flat emitter, the glow cathode 13 shown in FIG. 4 is formed as a shaped emitter, i.e., that region wherein the emission of electrons should ensue is not planar, but curved; this region in FIG. 4 is a concave-cylindrical surface.

Otherwise, the glow cathode 13 is constructed analogously to the glow cathode 10.

It is clear that the protective layer 8' (if used,) can no longer be present during operation of the glow cathodes 10 and 13 since a proper functioning of the glow cathodes 10 and 13 would otherwise not be assured.

In the case of the glow cathodes 10 and 13, the current passage during operation ensues through the substrate 1 as well as through the iridium-lanthanum layer 9 insofar as the substrate 1 is formed of an electrically conductive material. In the case of a substrate formed of an electrically insulating material, the current passage ensues only through the iridium-lanthanum layer 9. In order to avoid excessively high filament currents, it can be expedient to fashion the substrate of a material that is composed of electrically conductive and electrically insulating components.

Figure 5:
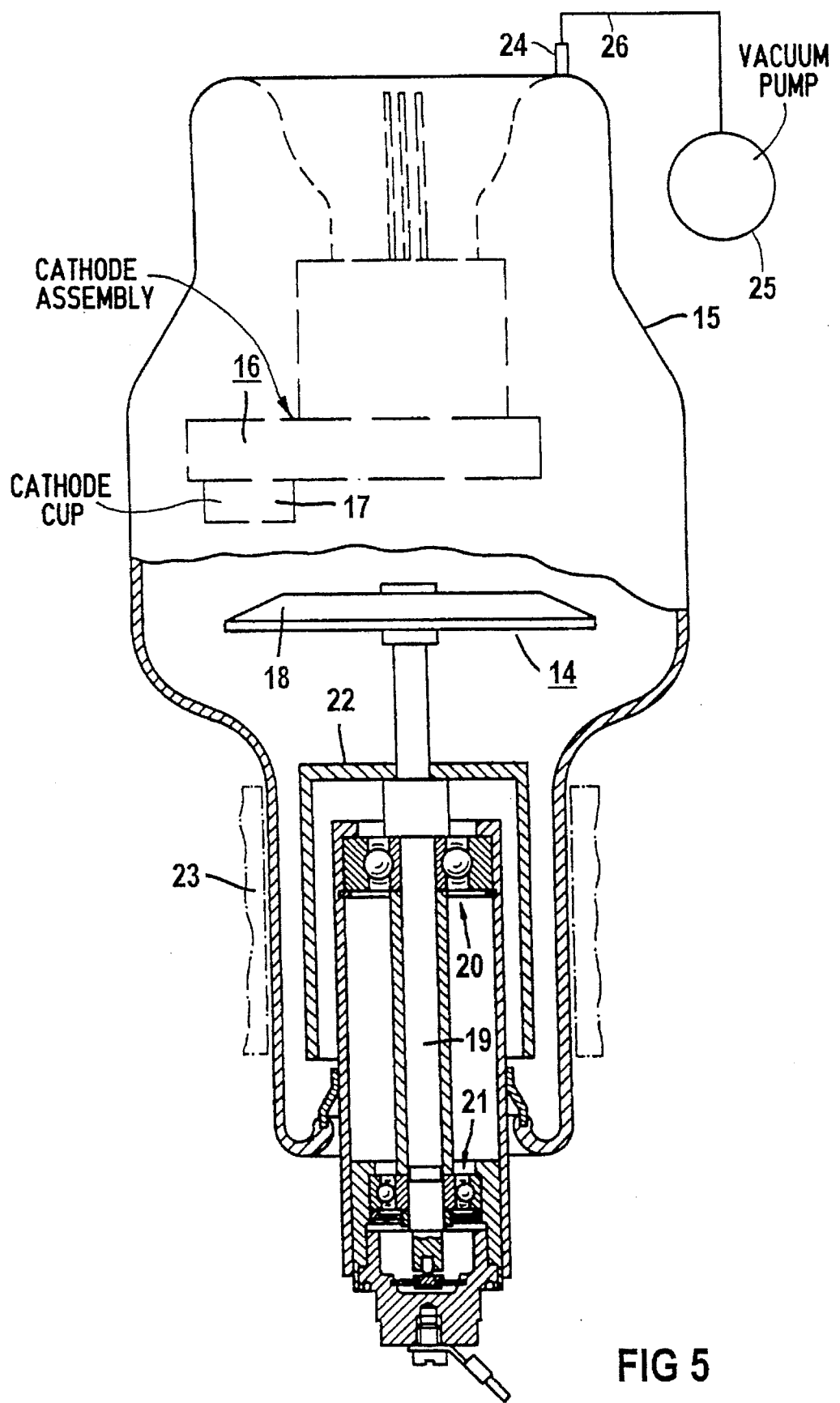
FIG. 5 shows an x-ray tube that contains a glow cathode of the invention, during the manufacturing process of the invention.

FIG. 5 shows an x-ray tube that has a rotating anode assembly generally referenced 14 accommodated in a vacuum bulb 15. The vacuum bulb 15 also contains a cathode assembly 16 in a known way. A glow cathode (not visible in FIG. 5) that contains a substrate manufactured in conformity with the disclosed method and, for example, that is fashioned according to FIG. 3 or FIG. 4 is accepted in the cathode cup 17 of the cathode assembly.

The rotating anode assembly 14 includes an anode dish 18 that is firmly attached to the one end of a bearing shaft 19. In order to rotatably support the rotating anode assembly 14, two plain bearings 20 and 21 are provided.

An electric motor 14 whose rotor 22 is firmly connected to the bearing shaft 19 is provided to place the shaft 19 and anode dish 18 in rotation. The schematically indicated stator 23 is put in place onto the outside wall of the vacuum bulb 15 in the region of the rotor 22 and forms an electrical squirrel-cage motor with the rotor 22 that causes the shaft 19 and anode dish 18 to rotate when supplied with the corresponding current.

When the filament voltage for the glow cathode of the cathode assembly 16 and the x-ray tube voltage that is across the cathode assembly 16 and the rotating anode assembly 14 are applied in a standard way (not shown), an electron beam emanates from the glow cathode of the cathode assembly 16, and is incident on the anode dish 18 in the focal spot or focus and triggers x-rays thereat which emerge from the x-ray tube through the vacuum bulb 15. As a consequence of the rotation of the anode dish 18, a focal spot path having an annular shape is formed on the anode dish 18 since a different location of the anode dish 18 is always charged with the electron beam.

The vacuum bulb 15 has a pump nozzle 24 that serves the purpose of making a connection a vacuum pump 25 during the manufacturing process of the x-ray tube for evacuating the inside of the vacuum bulb 15. After the evacuation has been completed, the pump nozzle 24 is closed vacuum-tight.

Baking of the x-ray tube ensues during the course of evacuating the vacuum bulb 15. With the vacuum bulb 15 already evacuated and with the vacuum pump connected to the pump nozzle 24 (which has not yet been closed), the x-ray tube is thereby placed into operation. As a consequence of the pronounced heating of the x-ray tube which thereby occurs, gaseous contaminants are expelled from the components of the x-ray tube, or contaminants having a low melting point evaporate and are suctioned out of the inside of the vacuum bulb 15 with the vacuum pump, schematically indicated in FIG. 5 connected to the pump nozzle 24 via a conduit 26.

Since, during the course of the baking, the glow cathode is heated to temperatures that are lower than the melting temperature of that phase of iridium-lanthanum having the lowest melting point and that also are adequate for forming an alloy, there is the possibility, in a further version of the method from that set forth above, of foregoing the heating after the coating of the substrate and instead undertaking the heating during the course of the baking of the x-ray tube.

The protective layer 8' of the glow cathode is also evaporated during the course of baking, insofar as the protective layer happens still to be present at this point in time.

Figure 6:
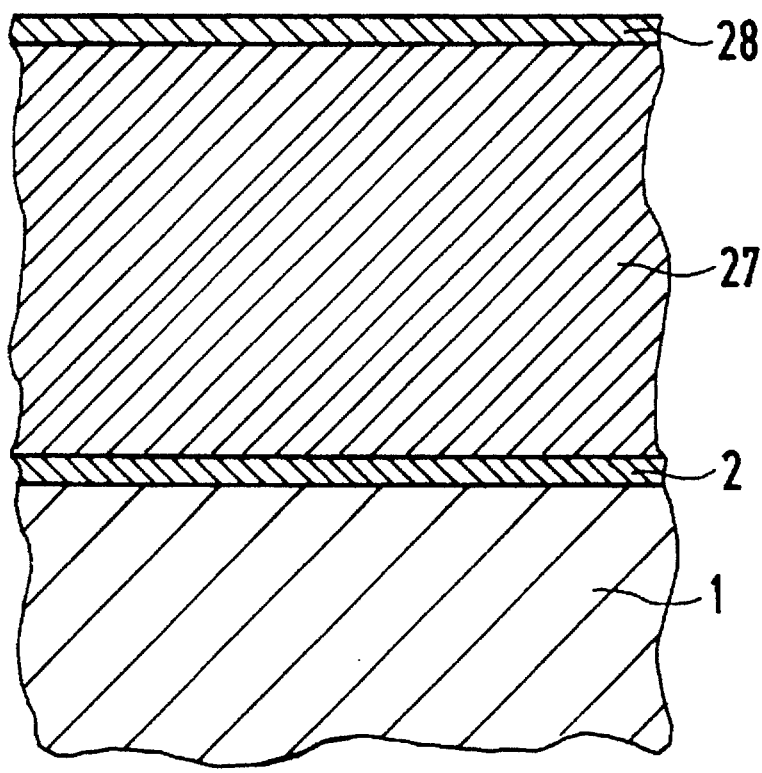
FIG. 6 is an illustration analogous to FIG. 2 of a substrate intended for a glow cathode having a layer manufactured according to a further version of the inventive method, after tempering.

The embodiment shown in FIG. 6 in an illustration analogous to that of FIG. 2 differs from that set forth above in that the substrate 1 was coated with the metal, for example iridium, and the element of the group, for example cerium, simultaneously, for example according to one of the initially cited methods for the formation of a single layer 27, rather than by the application of iridium and cerium alternating layer-by-layer. It must be assured upon the application of the layer 27 that—with reference to the overall layer 27—iridium and cerium are present in the stoichiometric ratio required for the formation of the alloy that is desired. Locally divergent amount ratios can be present after the coating that are at least partially compensated during the course of a heating to a temperature below the melting temperature of that phase of the system iridium-cerium, namely of the eutectic, having the lowest melting point that occurs in order to form the alloy. The melting temperature of the eutectic of the system iridium-cerium lies at 650° C.

The heating to a temperature below the melting temperature of that phase of the iridium-cerium system having the lowest melting point ensues such that the heating which occurs during the coating process is exploited and, following the coating, a temperature of, for example, 500° C. is still maintained for a time, with the application of heat as necessary, that is required in order to essentially conclude the alloy formation.

A layer 2 effective as a diffusion barrier and wetting agent is again provided between the substrate 1 and the layer 27.

Following the coating process for producing the layer 27 and the heating required for the formation of the alloy, a protective layer 28 of the metal, i.e. of iridium, was produced on the layer 27 by deposition from the vapor phase at a temperature of a maximum of 200° C.

In the two exemplary embodiments set forth above, a heating to a temperature that is lower than the melting temperature of the phase of the alloy having the lowest melting point respectively ensues for the alloy formation. When it is assured that damage to the substrate will not occur, however, higher temperatures are also possible, for example on the order of magnitude of 1500° C.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for manufacturing a glow cathode for an electron tube, comprising the steps of:

selecting a metal from the group consisting of Ru, Rh, Pd, Os, Ir, Pt and Re;

selecting an element from the group consisting of Ba, Ca, La, Y, Gd, Ce, Th and U;

providing a substrate;

coating said substrate with said metal and said element by vapor deposition in respective quantities for producing a stoichiometric ratio of said metal and said element on said substrate corresponding to a composition of an alloy to be produced; and heating said substrate with said metal and said element thereon for a duration for forming a layer of said alloy on said substrate.

2. A method as claimed in claim 1 wherein said alloy has a phase having a lowest melting temperature, and wherein the step of heating said substrate comprises heating said substrate to a temperature which is lower than the melting temperature of said phase of said alloy having the lowest melting temperature.

3. A method as claimed in claim 1 wherein the step of heating said substrate is conducted simultaneously with the step of coating said substrate with said metal and said element.

4. A method as claimed in claim 3 wherein said alloy has a phase having a lowest melting temperature, and wherein the step of heating said substrate during said coating comprises heating said substrate to a temperature during the coating which is lower than the melting temperature of the phase of the alloy having the lowest melting temperature.

5. A method as claimed in claim 1 wherein the step of coating said substrate with said metal and said element comprises coating said substrate in alternation with respective layers of said metal and said element.

6. A method as claimed in claim 1 wherein the step of coating said substrate with said metal and said element comprises simultaneously coating said substrate with said metal and said element.

7. A method as claimed in claim 6 wherein the step of simultaneously coating said substrate with said metal and said element comprises evaporating said metal and said element onto said substrate separately but simultaneously.

8. A method as claimed in claim 6 wherein the step of simultaneously coating said substrate with said metal and said element comprises evaporating a material containing both said metal and said element onto said substrate.

9. A method as claimed in claim 1 comprising the additional step of, following coating of said substrate with said metal and said element, vapor-depositing a thin layer of said metal.

10. A method as claimed in claim 9 wherein the step of coating said substrate with said metal and said element comprises coating said substrate in alternation with respective layers of said metal and said element, and wherein the step of vapor-depositing said thin layer of metal comprises vapor-depositing a thin layer of said metal as a last layer of the alternating layers of said metal and said element with said thin layer of said metal having a thickness exceeding a stoichiometric thickness required for formation of said alloy so that a layer of said metal remains after formation of said alloy.

11. A method as claimed in claim 9 wherein the step of vapor-depositing said thin layer of said metal comprises vapor-depositing said thin layer of said metal with a thickness not substantially exceeding a thickness required for protecting a portion of said coating of said metal and said element disposed immediately beneath said thin layer of metal.

12. A method as claimed in claim 1 wherein said metal comprises Ir and wherein said element comprises La.

13. A method as claimed in claim 1 comprising the additional step of, before coating said substrate with said metal and said element, covering said substrate with a thin layer of a diffusion barrier material.

14. A method as claimed in claim 13 comprising the additional step of, before coating said substrate with said metal and said element, covering said thin layer of diffusion barrier material with a thin layer of a wetting agent material.

15. A method as claimed in claim 1 wherein the step of providing a substrate comprises providing a substrate of refractory material selected from the group consisting of W, Mo, Ta, Nb and $ZrO_2$.

16. A method as claimed in claim 15 wherein said alloy has a phase having a lowest melting temperature, and comprising the additional steps of:

forming said substrate coated with said metal and said element into a glow cathode;

incorporating said glow cathode into an enclosure of an electron tube; and conducting said heating of said substrate with said coating of said metal and said element thereon for forming said alloy inside said electron tube by heating said substrate with said metal and said element thereon to a temperature below the melting temperature of the phase of the alloy having the lowest melting temperature.

17. A method as claimed in claim 16 comprising conducting the step of heating said substrate with said metal and said element thereon inside said electron tube during baking of said electron tube.

18. A method as claimed in claim 1 comprising the additional step of forming said substrate with said metal and said element thereon into a flat electron emitter.

19. A method as claimed in claim 1 comprising the additional step of forming said substrate with said metal and said element thereon into a shaped electron emitter.

20. A method as claimed in claim 1 wherein the step of coating said substrate with said metal and said element comprises coating said substrate with said metal and said element only in a region at which emission of electrons from a glow cathode comprised of said substrate with said alloy formed therein is desired.

* * * * *